US012693335B2

(12) United States Patent
Liu

(10) Patent No.: US 12,693,335 B2
(45) Date of Patent: Jul. 28, 2026

(54) POWER DISPLAY METHOD AND APPARATUS, AND ELECTRONIC DEVICE

(71) Applicant: VIVO MOBILE COMMUNICATION CO., LTD., Chang'an Dongguan (CN)

(72) Inventor: Shiwei Liu, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 916 days.

(21) Appl. No.: 17/994,098

(22) Filed: Nov. 25, 2022

(65) Prior Publication Data

US 2023/0092801 A1 Mar. 23, 2023

Related U.S. Application Data

(63) Continuation of application No. PCT/CN2021/096188, filed on May 26, 2021.

(30) Foreign Application Priority Data

May 28, 2020 (CN) .......................... 202010468966.3

(51) Int. Cl.
G01R 31/36 (2020.01)
H01M 10/42 (2006.01)
H02J 7/42 (2026.01)

(52) U.S. Cl.
CPC ..... G01R 31/3646 (2019.01); G01R 31/3648 (2013.01); H01M 10/425 (2013.01);
(Continued)

(58) Field of Classification Search
USPC ........................................ 320/108
See application file for complete search history.

(56) References Cited

U.S. PATENT DOCUMENTS

2015/0177334 A1 6/2015 Li et al.
2016/0020637 A1* 1/2016 Khlat ........................ H02J 7/02
320/108
2019/0130451 A1* 5/2019 Logvinov .......... G06Q 30/0272

FOREIGN PATENT DOCUMENTS

CN 101106281 A 1/2008
CN 101436690 A 5/2009
(Continued)

OTHER PUBLICATIONS

European Patent Office "Extended European Search Report" From Application No. 21813644.8, Dated Jan. 15, 2024, pp. 8.
(Continued)

*Primary Examiner* — Mohammed Alam
(74) *Attorney, Agent, or Firm* — Fredrikson & Byron, P.A.

(57) ABSTRACT

Embodiments of the present disclosure provide a power display method and apparatus, and an electronic device. The method includes: determining, in a case that a target condition is satisfied, a target charging power in each of N pieces of preset duration, to obtain N target charging power, where N is a positive integer; determining a target consumed power in each of the N pieces of preset duration, to obtain N target consumed power; and generating a target charging curve according to a current remaining power, N target charging power, and N target consumed power of the electronic device, where the target condition is that the electronic device is in a charging state, or the electronic device is in a simulated charging state.

20 Claims, 9 Drawing Sheets

(52) U.S. Cl.
CPC ....... *H02J 7/42* (2026.01); *H01M 2010/4271*
(2013.01); *H01M 2010/4278* (2013.01)

(56) References Cited

FOREIGN PATENT DOCUMENTS

| | | | | | |
|---|---|---|---|---|---|
| CN | 105071486 | A | | 11/2015 | |
| CN | 105680521 | A | | 6/2016 | |
| CN | 107231022 | A | | 10/2017 | |
| CN | 108099641 | A | | 6/2018 | |
| CN | 108832674 | A | | 11/2018 | |
| CN | 110579712 | A | | 12/2019 | |
| CN | 111079054 | A | | 4/2020 | |
| CN | 111431250 | A | | 7/2020 | |
| CN | 117984845 | A | * | 5/2024 | .............. B60L 53/00 |
| WO | WO-2013017161 | A1 | * | 2/2013 | ............ H02J 7/0013 |
| WO | 2018076271 | A1 | | 5/2018 | |

OTHER PUBLICATIONS

International Patent Application No. PCT/CN2021/096188, International Search Report and Written Opinion with Partial English Machine Translation mailed Aug. 6, 2021, 11 pages.

* cited by examiner

31

Power supply
management

POWER DISPLAY METHOD AND APPARATUS, AND ELECTRONIC DEVICE

CROSS-REFERENCE TO RELATED APPLICATIONS

This application is a continuation of International Application No. PCT/CN2021/096188, filed on May 26, 2021, which claims priority to Chinese Patent Application No. 202010468966.3, filed with the China National Intellectual Property Administration on May 28, 2020 and entitled "POWER DISPLAY METHOD AND APPARATUS, AND ELECTRONIC DEVICE", which is incorporated herein by reference in its entirety.

TECHNICAL FIELD

Embodiments of this application relate to the field of communication technologies, and in particular to a power display method and apparatus, and an electronic device.

BACKGROUND

With the development of electronic devices, users use electronic devices more frequently, and an increasing amount of power consumption is required for the electronic devices.

Currently, an electronic device can be charged for supplementing power, and when the electronic device is in a charging state, a battery percentage is usually displayed on the electronic device to prompt the user of a charging situation of the electronic device.

However, since the battery percentage can represent only a current charging progress of the electronic device, and a charging process is usually a non-linear process, the user can determine only the current charging progress of the electronic device according to the battery percentage, but cannot determine a future charging situation of the electronic device. That is, the foregoing power prompting method is not flexible.

SUMMARY

According to a first aspect of the present disclosure, a power display method is provided, where the method includes: determining, in a case that a target condition is satisfied, a target charging power in each of N pieces of preset duration, to obtain N target charging power, where N is a positive integer; determining a target consumed power in each of the N pieces of preset duration, to obtain N target consumed power; and generating a target charging curve according to a current remaining power, N target charging power, and N target consumed power of the electronic device, where the target condition is that the electronic device is in a charging state, or the electronic device is in a simulated charging state.

According to a second aspect of the present disclosure, a power display apparatus is provided, which includes: a determining module, a generating module, and a display module, where the determining module is configured to: determine a target charging power in each of N pieces of preset duration in a case that a target condition is satisfied, to obtain N target charging power; and determine a target consumed power in each of the N pieces of preset duration, to obtain N target consumed power, where N is a positive integer; the generating module is configured to generate a target charging curve according to a current remaining power of the electronic device, and the N target charging power and the N target consumed power determined by the determining module; and the display module is configured to display the target charging curve generated by the generating module, where the target condition is that the electronic device is in a charging state, or the electronic device is in a simulated charging state.

According to a third aspect of the present disclosure, an electronic device is provided, which includes a processor, a memory, and a computer program that is stored in the memory and that can be run on the processor, where when the computer program is executed by the processor, the steps of the power display method according to the first aspect are implemented.

According to a fourth aspect of the present disclosure, a computer-readable storage medium is provided, where the computer-readable storage medium stores a computer program, and when the computer program is executed by a processor, the steps of the power display method according to the first aspect are implemented.

DESCRIPTION OF EMBODIMENTS

Figure 1:
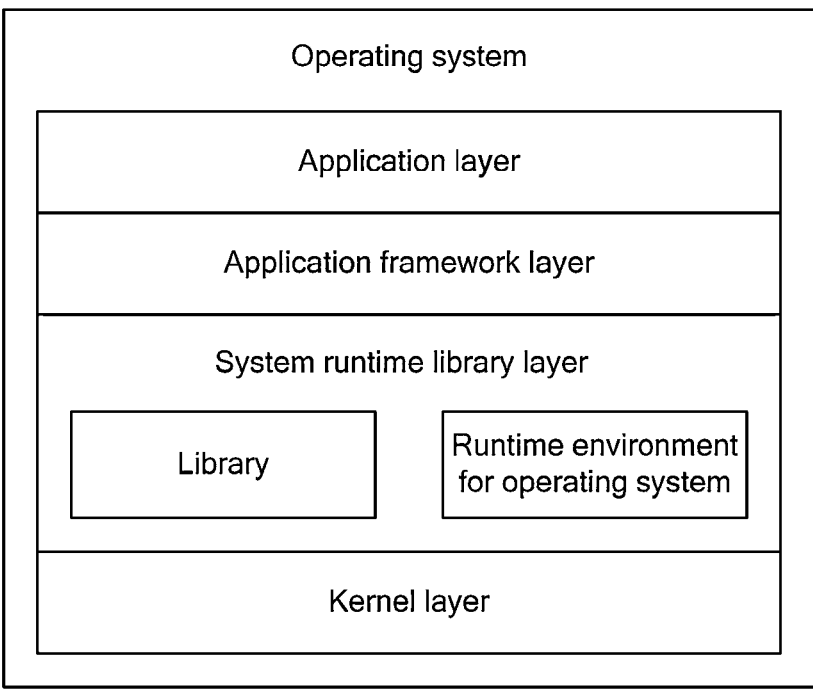
FIG. 1 is a schematic architectural diagram of a possible operating system according to an embodiment of the present disclosure.

The following clearly describes the technical solutions in the embodiments of the present disclosure with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure without creative efforts shall fall within the protection scope of this application.

It should be noted that, the character "/" in this specification represents the meaning of "or", for example, A/B may represent A or B; and the term "and/or" in this specification describes only an association relationship for describing associated objects and represents that three relationships may exist. For example, A and/or B may represent the following three cases: Only A exists, both A and B exist, and only B exists.

It should be noted that "multiple" in this specification means two or more.

It should be noted that, in the embodiments of the present disclosure, the word "exemplary" or "for example" is used to represent giving an example, an illustration, or a description. Any embodiment or design solution described as "exemplary" or "for example" in the embodiments of the present disclosure should not be construed as being more preferred or advantageous than other embodiments or design solutions. To be precise, the use of the term such as "exemplary" or "for example" is intended to present a related concept in a specific manner.

It should be noted that, for ease of clearly describing the technical solutions in the embodiments of the present disclosure, in the embodiments of the present disclosure, the words "first", "second", and the like are used to distinguish between same or similar items with basically the same functions. A person skilled in the art may understand that the words "first", "second", and the like do not limit a quantity and an execution sequence. For example, the first input and the second input are used to distinguish between different inputs, instead of describing a specific order of inputs.

A power display method provided by an embodiment of the present disclosure may be performed by the foregoing electronic device (including a mobile electronic device and a non-mobile electronic device), or may also be performed by a functional module and/or functional entity that can implement the power display method in the electronic device, which may be determined according to actual use requirements and is not limited by the embodiment of the present disclosure. Taking the electronic device as an example, the following exemplarily describes the power display method provided in the embodiments of the present disclosure.

The electronic device in the embodiments of the present disclosure may be a mobile electronic device or a non-mobile electronic device. The mobile electronic device may be a mobile phone, a tablet computer, a laptop computer, a palmtop computer, an in-vehicle electronic device, a wearable device, an ultra-mobile personal computer (ultra-mobile personal computer, UMPC), a netbook, a personal digital assistant (personal digital assistant, PDA), or the like. The non-mobile electronic device may be a personal computer (personal computer, PC), a television (television, TV), an automated teller machine, a self-service machine, or the like. This is not specifically limited in the embodiments of the present disclosure.

The electronic device in the embodiments of the present disclosure may be an electronic device with an operating system. The operating system may be an Android (Android) operating system, an iOS operating system, or another possible operating system, which is not specifically limited in the embodiments of the present disclosure.

The following takes the Android operating system shown in FIG. 1 as an example to introduce a software environment to which the power display method provided in the embodiments of the present disclosure is applied.

FIG. 1 is a schematic diagram of an architecture of a possible operating system according to an embodiment of the present disclosure. In FIG. 1, an architecture of the operating system includes four layers: an application layer, an application framework layer, a system runtime library layer, and a kernel layer (which may be specifically a Linux kernel layer).

The application layer includes all applications (including a system application and a third-party application) in the operating system.

The application framework layer is a framework of application, and the developer may develop some applications based on the application framework layer when following a development rule of the application framework.

The system runtime library layer includes a library (also referred to as a system library) and an operating system runtime environment. The library mainly provides the operating system with various resources required by the operating system. The operating system runtime environment is used to provide the operating system with a software environment.

The kernel layer is an operating system layer of the operating system, and is a bottom-most layer in operating system software layers. The kernel layer provides the operating system with a core system service and a hardware-related driver based on the Linux kernel.

The operating system shown in FIG. 1 is used as an example. In an embodiment of the present disclosure, based on the architecture of the operating system shown in FIG. 1, a developer can develop a software program that implements the power display method provided in the embodiment of the present disclosure, so that the power display method can be performed based on the operating system shown in FIG. 1. That is, a processor or the electronic device may run the software program in the operating system to implement the power display method provided in the embodiments of the present disclosure.

The power display method provided in the embodiments of the present disclosure can be applied to multiple scenarios. For example, the power display method can be applied to a scenario where a user needs to know a charged power for the electronic device under charged for a period of time in the future, or can be applied to a scenario where the user needs to know a charged power for the electronic device under virtually charged for a period of time in the future.

For example, the user needs to know a charged power for the electronic device under charged for a period of time in the future, when the electronic device is charged, the electronic device can calculate a power to be charged to and a power to be consumed by the electronic device in certain duration in the future. In this case, the electronic device can also generate an estimated charging curve according to a current remaining power of the electronic device and display the estimated charging curve to the user, so that the user can visually see a charging situation in certain duration in the future, and then the electronic device can prompt power flexibly.

Figure 2:
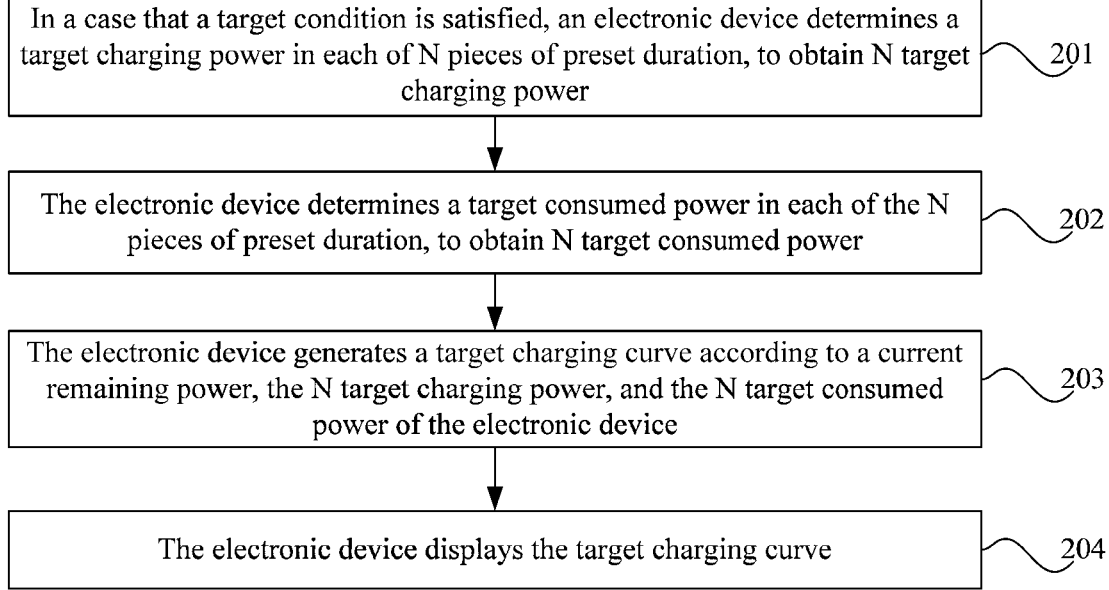
FIG. 2 is a schematic flow chart of a power display method according to an embodiment of the present disclosure.

The power display method in an embodiment of the present disclosure is described as follows with reference to a flow chart of the power display method shown in FIG. 2. FIG. 2 is a schematic flow chart of the power display method according to an embodiment of the present disclosure, including step 201 to step 204.

Step 201: An electronic device determines, in a case that a target condition is satisfied, a target charging power in each of N pieces of preset duration, to obtain N target charging power.

In this embodiment of the present disclosure, the target condition is that the electronic device is in a charging state, or the electronic device is in a simulated charging state.

It can be understood that the electronic device being in a charging state means that the electronic device is electrically connected to a charging apparatus of the electronic device.

It can be understood that the electronic device being in a simulated charging state means that the electronic device is not electrically connected to the charging apparatus of the electronic device. Alternatively, the state is a state that the electronic device is not physically connected to the charging apparatus of the electronic device, or a state that the electronic device is physically connected to but not electrically connected to the charging apparatus of the electronic device.

It should be noted that the determining a target charging power in each of N pieces of preset duration can be understood as calculating the target charging power in each of the N pieces of preset duration.

In an example, in a case that the electronic device detects that the electronic device is electrically connected to the charging apparatus of the electronic device, the electronic device can calculate the target charging power in each of the N pieces of preset duration, that is, determine the N target charging power.

In this embodiment of the present disclosure, the preset duration may be a system default, or may be set by the user, which is not limited in this embodiment of the present disclosure. For example, the preset duration may be 2 minutes.

In this embodiment of the present disclosure, the value of N may be a default value of the system, or may be set by the user, which is not limited in this embodiment of the present disclosure. N is a positive integer.

In an example, if the electronic device knows estimated total duration and preset duration, the electronic device can obtain the value of N by dividing the estimated total duration by the preset duration.

For example, if the electronic device knows that the estimated total duration is 30 minutes and the preset duration is 2 minutes in the future, the electronic device can obtain that the value of N is 15.

In another example, if the electronic device knows the preset duration and the value of N, the electronic device can obtain the estimated total duration by multiplying the preset duration by N.

For example, the target charging power in each piece of preset duration may be equal to a value of a charging rate multiplied by charging duration (that is, the preset duration). For example, the charging rate can be obtained through an experiment, for example, the charging rate is a statistical mean of historic charging rates.

For example, the target charging power in each piece of preset duration may be the same or different, which is not limited in this embodiment of the present disclosure.

It can be understood that the target charging power is affected by many factors, for example, a battery voltage of the electronic device, a battery temperature, or a temperature of an environment where the electronic device is located. Therefore, the target charging power in each piece of preset duration may be different.

Optionally, in an embodiment of the present disclosure, in a case that the electronic device satisfies the target condition, to prevent the electronic device from accidentally triggering calculation of the target charging power so as to reduce a workload of the electronic device, the electronic device may be triggered by the user to perform calculation.

For example, the foregoing step 201 may include the following step 201*a* and step 201*b*.

Step 201*a*: The electronic device receives a first input by the user when the target condition is satisfied.

The first input may include: a tap input on a screen of the electronic device, a voice command input by the user, or a specific gesture input by the user, which can be determined according to actual use requirements and is not limited in this embodiment of the present disclosure.

The specific gesture in the embodiment of the present disclosure may be any one of a tap gesture, a sliding gesture, a drag gesture, a pressure recognition gesture, a touch-and-hold gesture, an area change gesture, a double-touch gesture, or a double-tap gesture. The tap input in this embodiment of the present disclosure may be a tap input, a double-tap input, a tap input for any number of times, or the like, or may also be a touch-and-hold input or touch input.

In an example, the tap input on the screen of the electronic device may be a tap input on a specific application on the screen of the electronic device. The specific application may be an existing application or a new application, which is not limited in this embodiment of the present disclosure.

Step 201*b*: The electronic device determines, in response to the first input, the target charging power in each of the N pieces of preset duration, to obtain the N target charging power.

Figure 3:
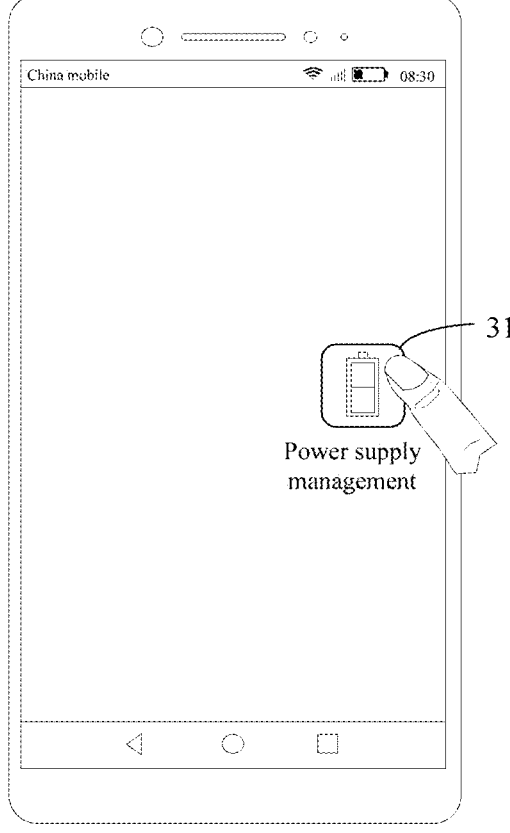
FIG. 3 is a first schematic diagram of a screen for application of a power display method according to an embodiment of the present disclosure.

For example, a user goes out at 9:00 in the morning, finds that the mobile phone is in a low battery level at 8:30, and needs to have the electronic device charged, the preset duration is 2 minutes, and the user needs to know a charging situation of the electronic device in next 30 minutes. As shown in FIG. 3, the user can tap an application icon of a "Power Supply Management" application (that is, the foregoing specific application, such as 31 in FIG. 3). In this case, the electronic device calculates target charging power in each of 15 pieces of preset duration, to obtain 15 target charging power.

This way, only after receiving the first input by the user, the electronic device will start to calculate the target charging power in each of the N pieces of preset duration, so that it can be prevented that calculation of the electronic device by mistake is started, and the workload of the electronic device can be reduced.

Step 202: The electronic device determines a target consumed power in each of the N pieces of preset duration, to obtain N target consumed power.

In an embodiment of the present disclosure, the target consumed power in each piece of preset duration may include at least one of the following: a power consumed by an application running on the electronic device, a power consumed by an external device (for example, a speaker, a peripheral keyboard, or the like) of the electronic device, or a power consumed by an electronic device system (for example, a screen, an electronic component, or the like).

For example, the application running on the electronic device may include at least one of the following: an application running in a background of the electronic device and an application running in a foreground of the electronic device.

It can be understood that, if the target condition is simulated charging for the electronic device, the running application is not a really running application, but a simulated running application.

For example, the simulated running application may be selected by the user through the electronic device. Definitely, in a case that the battery level is lower than a preset power threshold, a window for running simulated charging for the electronic device automatically pops up, which can not only prompt the user of charging, but also timely recommend a charging strategy suitable for the user.

Figure 4:
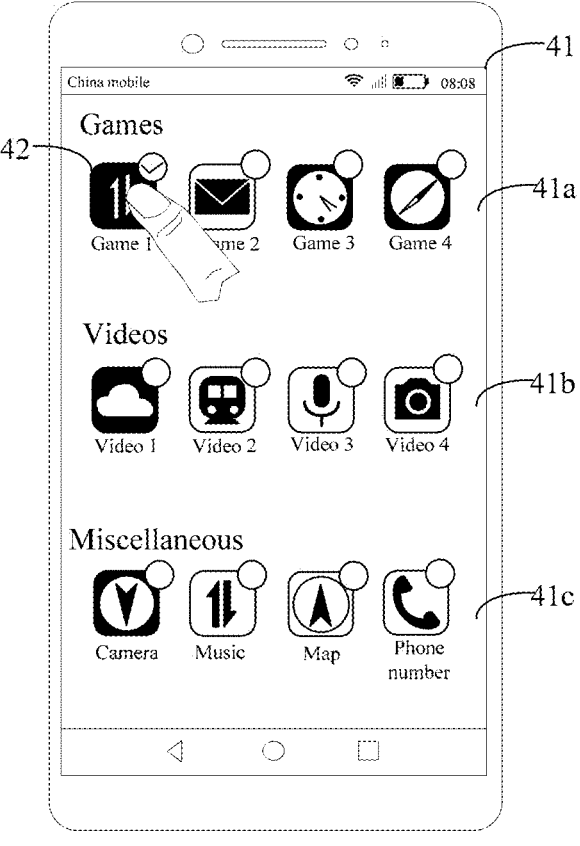
FIG. 4 is a second schematic diagram of a screen for application of the power display method according to an embodiment of the present disclosure.

For example, the preset duration is 2 minutes, if the user will go out at 9:00 in the morning but finds, at 8:30, that the mobile phone is in a low battery level, the user needs to know a charging situation of the electronic device at 9:00 in a case that the user enables an application of game 1 for playing games during charging. In this case, with reference to FIG. 3, after the user taps the application icon 31 of a power supply management application, as shown in FIG. 4, the electronic device displays a custom setting screen (that is, 41 in FIG. 4), and the custom setting screen 41 is divided into three regions, which are respectively a region 41a, region 41b, and region 41c. Options for 4 game applications are displayed in the region 41a, namely an option of game 1, option of game 2, option of game 3, and option of game 4. Options for 4 video applications are displayed in the region 41b, namely an option of video 1, option of video 2, option of video 3, and option of video 4. Options for 4 applications of other types are displayed in the region 41c, namely a camera option, music option, map option, and phone option. In this case, the user can tap the option of game 1 (that is, 42 in FIG. 4), and then the electronic device can calculate target consumed power of the game 1 application in each of 15 pieces of preset duration.

For example, for power consumed by an application running on the electronic device, the electronic device can obtain a statistical mean of corresponding historic consumed power of each application in a case that the electronic device runs normally.

For example, the target consumed power in each piece of preset duration may be the same or different, which is not limited in this embodiment of the present disclosure.

It should be noted that a sequence for determining the target charging power in each of the N pieces of preset duration in step 201, to obtain N pieces of target charging power and step 202 is not determined. For example, the electronic device can perform, before performing step 202, step 201 to calculate the target charging power in each of the N pieces of preset duration, to obtain the N target charging power. The electronic device can also perform, after performing step 202, step 201 to calculate the target charging power in each of the N pieces of preset duration, to obtain the N target charging power. The electronic device can further perform, while performing step 202, step 201 to calculate the target charging power in each of the N pieces of preset duration, to obtain the N target charging power. This can be set according to actual requirements and is not limited in this embodiment of the present disclosure.

Step 203: The electronic device generates a target charging curve according to a current remaining power, the N target charging power, and the N target consumed power of the electronic device.

For example, the current remaining power of the electronic device refers to a power of the electronic device corresponding to a start time of first preset duration in the N pieces of preset duration.

Optionally, in this embodiment of the present disclosure, the foregoing step 203 may include the following step 203a to step 203d.

Step 203a: The electronic device determines a start point of the target charging curve according to the remaining power.

Step 203b: The electronic device determines a target charged power in each piece of preset duration according to the target charging power and the target consumed power in each piece of preset duration.

For example, the target charged power in each piece of preset duration is equal to a difference between the target charging power and the target consumed power in each piece of preset duration.

Step 203c: The electronic device determines a target point corresponding to each piece of preset duration on the target charging curve according to the target charged power.

It can be understood that the electronic device can determine N target points according to the target charged power in each piece of preset duration, and each target point corresponds to one piece of preset duration and a target charged power determined by the electronic device in the one piece of preset duration.

Step 203d: The electronic device generates the target charging curve according to the start point and the target point.

For example, the electronic device can connect the start point to the target point, draw the target charging curve, and then generate the target curve.

For example, the preset duration is 3 minutes, the electronic device can first determine the start point according to a current remaining power of the electronic device, and the electronic device can then calculate a target charging power and a target consumed power every 3 minutes in a next hour, and then determine a target charged power by subtracting the target consumed power from the target charging power. Next, the electronic device can determine a point corresponding to the target charging curve according to the target charged power and a 3-minute period, so that 20 estimated points corresponding to the target charging curve can be obtained. Finally, the electronic device can connect the start point to the 20 points to draw and generate the target charging curve.

Step 204: The electronic device displays the target charging curve.

For example, the target charging curve may be one or more curves, which is not limited in this embodiment of the present disclosure.

In an example, the electronic device can display the target charging curve in a window. For example, in a case that the electronic device is in a charging state, a window may pop up on the electronic device, and a target charging curve is displayed in the window.

It should be noted that the window may be an existing window or a new window, which is not limited in this embodiment of the present disclosure.

In an example, the electronic device can display the target charging curve in predetermined duration, and after the target charging curve has been displayed for the predetermined duration, the electronic device can cancel display of the target charging curve.

For example, the electronic device can display the target charging curve in a coordinate system. For example, the coordinate system may be a rectangular coordinate system, where an abscissa of the rectangular coordinate system represents preset duration, which may be in the form of time intervals, such as 10 mins, 20 mins, and 30 mins, or in the form of moment, such as 9:00, 9:10, and 9:20. An ordinate of the rectangular coordinate system represents an estimated charged power, which can be in the form of power percentage, for example, 30%, 40%, and 50%, or in the form of mAh, such as 1,000 mAh, 1,500 mAh, and 2,000 mAh.

It should be noted that the electronic device can adjust abscissa intervals and ordinate intervals of the rectangular coordinate system according to preset duration, a current remaining power, remaining charging duration, and the like.

Figure 5:
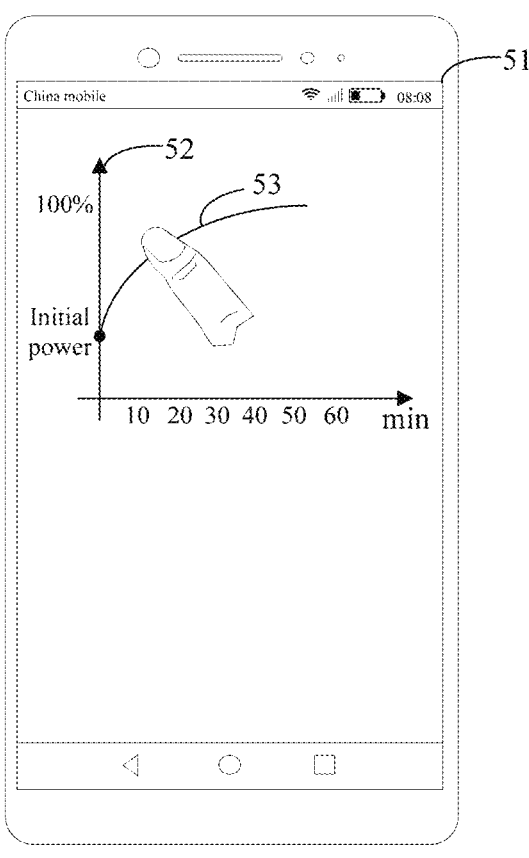
FIG. 5 is a third schematic diagram of a screen for application of the power display method according to an embodiment of the present disclosure.

For example, the abscissa is the time interval, and the ordinate is the power percentage, and a screen 51 of the electronic device as shown in FIG. 5 displays a target charging curve in next one hour. 10 mins, 20 mins, 30 mins, 40 mins, 50 mins, and 60 mins are respectively displayed on an abscissa of a rectangular coordinate system 52, and an initial power and 100% are respectively displayed on an ordinate of the rectangular coordinate system 52. A curve 53 is displayed in the rectangular coordinate system.

In an example, the electronic device can simultaneously display a target charging curve in a screen-off state of the electronic device and a target charging curve in a screen-on state of the electronic device.

In the power display method provided in this embodiment of the present disclosure, in a case that the electronic device satisfies a target condition (the electronic device is in a charging state or in a simulated charging state), the electronic device can determine a target charging power in each of N pieces of preset duration, to obtain N target charging power, and determine a target consumed power in each of the N pieces of preset duration, to obtain N target consumed power. Afterwards, the electronic device can generate a target charging curve according to a current remaining power, the N target charging power, and the N target consumed power of the electronic device. Next, the electronic device can display the target charging curve. Compared with a traditional way in which the electronic device prompts the user of a current charging progress of the electronic device, through the foregoing solution, the electronic device can visually display a future charging situation of the electronic device to the user by displaying the target charging curve, so that the user can not only view the current charging progress, but also view the future charging situation, which improves flexibility for prompting power by the electronic device.

Optionally, in this embodiment of the present disclosure, the user can view an estimated charged power and preset duration corresponding to any point on the target charging curve in real time.

For example, in a case that the target charging curve includes N target points, each target point corresponds to one target charged power and one of N pieces of preset duration, after the foregoing step 204, the method may further include the following step 205:

Step 205: The electronic device receives an input by the user on a first point of the N target points.

For example, the input by the user on a first point of the N target points may include: a tap input on the first point, a voice command input by the user, or a specific gesture input by the user, which can be determined according to actual use requirements and is not limited in this embodiment of the present disclosure.

Step 206: The electronic device displays, in response to the foregoing input, a target charged power and preset duration corresponding to the first point in a preset region corresponding to the first point.

For example, the preset region may be any region in the screen, for example, may be a region above a screen region where the first point is located, a region below a screen region where the first point is located, a region on the left of a screen region where the first point is located, a region on the right of a screen region where the first point is located, a region on the upper right of a screen region where the first point is located, a region on the lower right of a screen region where the first point is located, a region on the upper left of a screen region where the first point is located, or a region on the lower left of a screen region where the first point is located, which can be determined according to actual needs and is not limited in this embodiment of the present disclosure.

Figure 6:
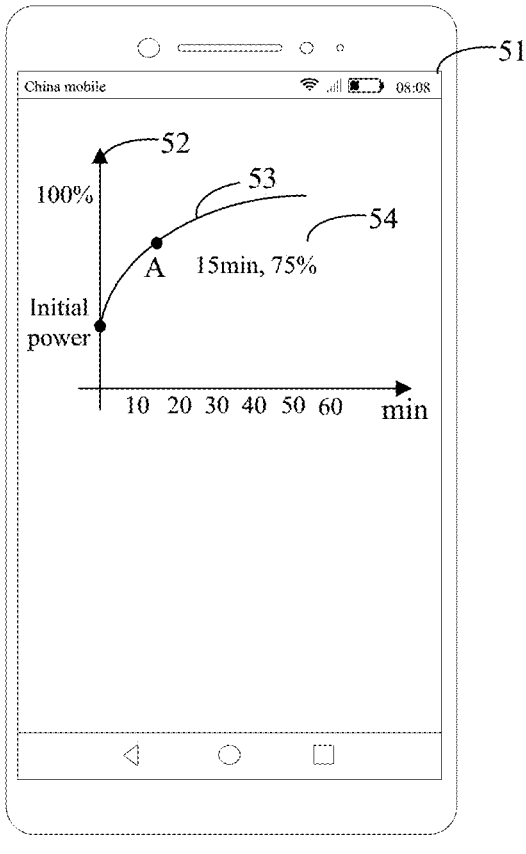
FIG. 6 is a fourth schematic diagram of a screen for application of the power display method according to an embodiment of the present disclosure.

For example, with reference to FIG. 5, after the electronic device displays the target charging curve, if the user needs to check a target charged power and preset duration corresponding to a point A, the user can tap the point A. In this case, as shown in FIG. 6, the electronic device displays "15 min, 75%" in a lower right region (54 in FIG. 6) of the point A.

This way, the user can tap a point on the target charging curve to view a target charged power in different pieces of duration in the future in real time, which can help the user judge a charging situation of the electronic device in a more refined manner, so that the user can plan a charging behavior more reasonably.

Optionally, in this embodiment of the present disclosure, since the target charging power is affected by multiple types of information, the electronic device may consider the influence of the multiple types of information on the target charging power, and then calculate the target charging power more accurately.

For example, the determining a target charging power in each of N pieces of preset duration, to obtain N target charging power in step 201 may include the following step 201*c* and step 201*d*.

Step 201*c*: The electronic device obtains first charging information of the electronic device.

For example, the first charging information is information related to charging for the electronic device.

Alternatively, the first charging information may include at least one of the following: a battery voltage, an ambient temperature, a battery temperature, a charging protocol, a charging strategy, or an estimated temperature rise. It should be noted that the first charging information includes but is not limited to the foregoing 6 types of information.

The battery temperature and ambient temperature can be obtained through a temperature sensor of the electronic device, and the charging strategy is a charging algorithm built into an electronic device system.

It should be noted that the user can determine the charging behavior according to information such as a temperature rise and a remaining power of the electronic device.

For example, the target charging power may change as the first charging information changes.

In example 1, the target charging power in the preset duration may increase as the first charging information increases, the target charging power in the preset duration may decrease as the first charging information decreases, the target charging power in the preset duration may increase as the first charging information decreases, or the target charging power in the preset duration may decrease as the first charging information increases. For example, the target charging power in the preset duration may decrease as the ambient temperature rises.

In example 2, if the first charging information is a charging protocol A, the target charging power in the preset duration is A; if the first charging information is a charging protocol B, the target charging power in the preset duration is B; and if the first charging information is a charging protocol C, the target charging power in the preset duration is C.

Step 201*d*: The electronic device determines, according to the first charging information, the target charging power in each of the N pieces of preset duration, to obtain the N target charging power.

For example, when the electronic device calculates the target charging power in each piece of preset duration, the electronic device can obtain the first charging information at a start time of each piece of preset duration, and then the electronic device can calculate the target charging power in each piece of preset duration according to the first charging information obtained at each start time.

It should be noted that, the influence of the first charging information on the target charging power can be obtained according to an experiment.

This way, the electronic device can fully consider the influence of the first charging information on the target charging power, so as to calculate the target charging power in each piece of preset duration relatively accurately, and then more accurately generate a target charging curve according to the relatively accurate target charging power.

Optionally, in an embodiment of the present disclosure, when the electronic device estimates the charged power, the electronic device needs to consider how to relatively accurately determine the charging power and how to relatively accurately determine consumed power of the electronic device.

For example, the foregoing step 202 may include the following step 202*a* and step 202*b*.

Step 202*a*: The electronic device obtains first consumption information of the electronic device.

The first consumption information is information related to current running of the electronic device.

Alternatively, the first consumption information includes at least one of the following: a running state of an application, a working situation of an external device of the electronic device, or a running state of an electronic device system.

The running state of the application may include a running state of a high-load application, and a running state of a low-load application can be ignored; a running state of the electronic device system may include a screen display state, a high-speed data exchange state, and the like; and the working situation of the external device of the electronic device may include a working situation of a speaker and the like.

Step 202*b*: The electronic device determines, according to the first consumption information, a target consumed power in each of the N pieces of preset duration, to obtain N target consumed power.

For example, the electronic device can calculate a statistical mean of historic consumed power of each application, obtain a consumed power per unit time, and use the obtained consumed power per unit time as a benchmark to calculate a target consumed power in preset duration. For example, according to the historic consumed power of an application A, the electronic device calculates that a consumed power of the application A is 5% every 10 minutes. Based on this, the electronic device can calculate that a target consumed power for running the application A for 2 minutes is 1%.

For example, when the electronic device calculates the target consumed power in each piece of preset duration, the electronic device can obtain the first consumption information at a start time of each piece of preset duration, and then the electronic device can calculate the target consumed power in each piece of preset duration according to the first consumption information obtained at each start time.

It should be noted that, when a value of the preset duration is relatively small, to reduce a computational burden of the electronic device, the electronic device can obtain first consumption information according to each piece of target duration. The target duration may be total duration corresponding to at least two pieces of preset duration, and then the electronic device can calculate a target consumed power in each piece of preset duration of the target duration according to a first consumption information obtained at a start time of the target duration.

This way, the electronic device can relatively accurately calculate the target consumed power in each piece of preset duration by obtaining the first consumption information, so as to generate a target charging curve more accurately by using the target consumed power.

Optionally, in an embodiment of the present disclosure, when the target charging curves are multiple curves, the multiple curves may be target charging curves under different charging protocols displayed by the electronic device according to the different charging protocols supported by the electronic device.

For example, in a case that the target charging curve includes at least two charging curves, and a preset charging parameter corresponding to each charging curve is not all the same, the foregoing step 204 may include the following step 204*a*:

Step 204*a*: The electronic device displays at least two charging curves in a same coordinate system.

For example, the preset charging parameter may include at least one of the following: a charging protocol, an ambient temperature, or a charging strategy. It should be noted that the preset charging parameter includes but is not limited to the foregoing three parameters.

For example, since different preset charging parameters (for example, the charging protocols) may correspond to different charging power, the electronic device can separately calculate N target charging power and N target consumed power corresponding to each charging protocol, thereby generating a target charging curve corresponding to each charging protocol.

Figure 7:
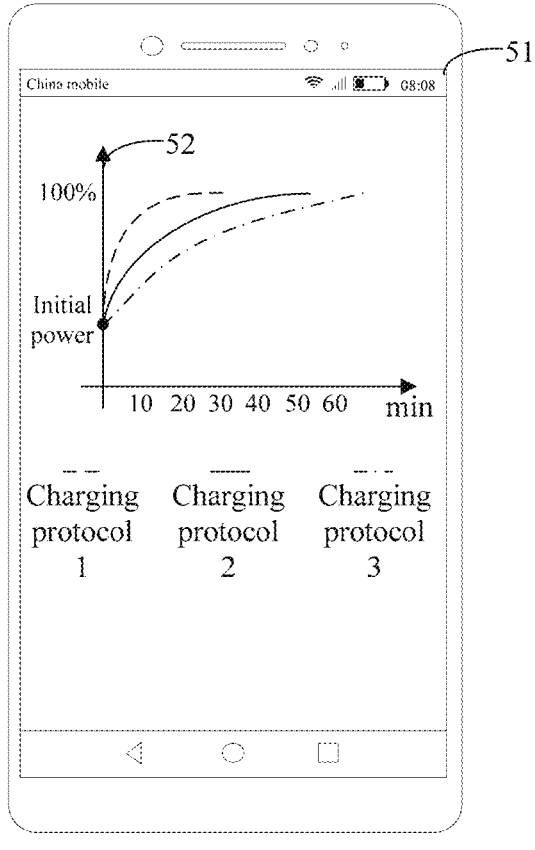
FIG. 7 is a fifth schematic diagram of a screen for application of the power display method according to an embodiment of the present disclosure.

For example, the preset duration is 3 minutes, with reference to FIG. 5, if the electronic device supports three charging protocols, namely, a charging protocol 1, a charging protocol 2, and a charging protocol 3 respectively, as shown in FIG. 7, the electronic device may display a target charging curve of the charging protocol 1, a target charging curve of the charging protocol 2, and a target charging curve of the charging protocol 3 in a rectangular coordinate system 52, respectively.

It should be noted that in a case that the electronic device is in a charging state, the electronic device can display only a target charging curve under a current charging protocol and a target charging curve under a charging protocol with a better estimated charging effect, without displaying target charging curves under all charging protocols supported by the electronic device.

This way, the electronic device can display target charging curves in a case of different preset charging parameters in the same coordinate system, so as to help the user view the target charging curves and compare future charging situations in a case of different preset charging parameters, so that the user can know a charging situation of the electronic device more comprehensively.

Further, in an embodiment of the present disclosure, the electronic device can prompt the user of charging apparatuses respectively corresponding to the at least two charging curves.

For example, the displaying at least two charging curves in step 204*a* may include the following step 204*a*1:

Step 204*a*1: The electronic device displays at least two target charging curves and displays a first identifier.

For example, the first identifier is used to indicate preset charging parameters respectively corresponding to the at least two target charging curves.

For example, there may be one or more first identifiers, which is not limited in this embodiment of the present disclosure.

For example, the identifiers in this application may include at least one of the following: a word and a picture.

After the foregoing step 204*a*1, the method may further include the following step 204*b* and step 204*c*.

Step 204*b*: The electronic device receives a second input for the first identifier.

For example, the second input may include: a tap input for the first identifier, a voice command input by the user, or a specific gesture input by the user, which can be determined according to actual use requirements and is not limited in this embodiment of the present disclosure.

Step 204*c*: The electronic device displays a second identifier.

For example, the second identifier is used to prompt the user of charging apparatuses respectively corresponding to the at least two target charging curves.

For example, the charging apparatuses may include a charger and a charging data cable.

For example, there may be one or more second identifiers, which is not limited in this embodiment of the present disclosure.

Figure 8:
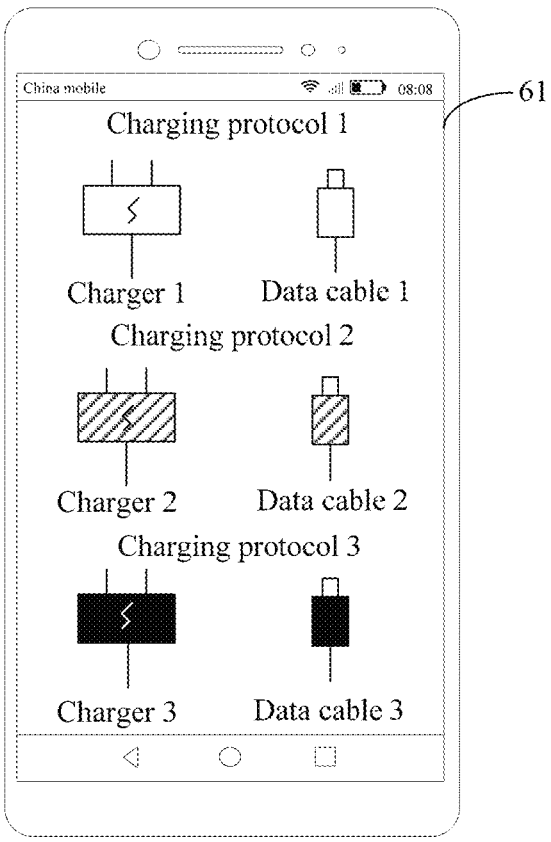
FIG. 8 is a sixth schematic diagram of a screen for application of the power display method according to an embodiment of the present disclosure.

For example, with reference to FIG. 7, when the user wants to view a charging apparatus corresponding to a charging protocol, the user can tap an icon of the protocol 2. As shown in FIG. 8, the electronic device displays a charging apparatus display screen 61. The charging apparatus display screen 61 displays pictures and names of a charger 1 and a data cable 1 corresponding to the protocol 1, pictures and names of a charger 2 and a data cable 2 corresponding to the protocol 2, and pictures and names of a charger 3 and a data cable 3 corresponding to the protocol 3.

This way, the electronic device can visually prompt the user of a charging apparatus supported by the electronic device by displaying a second identifier used to indicate the charging apparatus, so that the user can easily select the charging apparatus.

Optionally, in an embodiment of the present disclosure, in a case that the electronic device is in a charging state, the electronic device may prompt the user whether a current charging apparatus is the best charging apparatus.

For example, the foregoing target condition is that the electronic device is in the charging state, and the method may further include the following step 206 and step 207.

Step 206: In a case that the electronic device is in the charging state, the electronic device obtains a parameter of a first charging apparatus connected to the electronic device.

For example, after the electronic device is electrically connected to the charging apparatus, the electronic device can send a charging protocol signal to the charging apparatus, and after the charging apparatus receives the charging protocol signal, the charging apparatus can send its own parameter to the electronic device.

Step 207: The electronic device displays, in a case that the parameter of the first charging apparatus does not match a preset parameter, an identifier of a recommended charging apparatus and/or information about a target application recommended to be disabled.

For example, the preset parameter may be a parameter of the recommended charging apparatus, or may be a parameter preset by the user, which is not limited in this embodiment of the present disclosure.

For example, the identifier of the recommended charging apparatus may include: an identifier of a recommended charger and an identifier of a recommended data cable.

For example, compared with the first charging apparatus, the recommended charging apparatus can enable a battery of the electronic device to be fully charged in a shorter time or a charging voltage to be more stable, which is not limited in this embodiment of the present disclosure.

For example, the foregoing information about a target application recommended to be disabled may include: a name of the application recommended to be disabled and a picture of the application recommended to be disabled.

Figure 9:
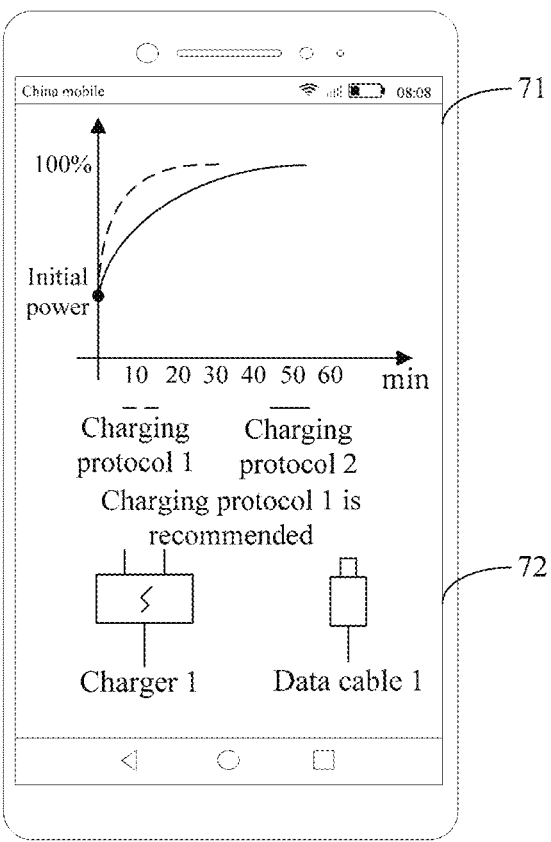
FIG. 9 is a seventh schematic diagram of a screen for application of the power display method according to an embodiment of the present disclosure.

For example, after the electronic device is electrically connected to a charging apparatus 2, the electronic device detects that a parameter of the charging apparatus 2 does not match a preset parameter. Therefore, as shown in FIG. 9, the electronic device can display, on an upper screen 71, a target charging curve corresponding to a charging protocol 2 corresponding to the charging apparatus 2 and a target charging curve corresponding to a charging protocol 1 with a better charging effect. Meanwhile, the electronic device can display, in a lower screen 72, pictures and names of a recommended charger 1 and data cable 1, and display a text "An application 1 is recommended to be disabled".

It should be noted that, in a case that the parameter of the first charging apparatus matches the preset parameter, the electronic device does not need to display the identifier of the recommended charging apparatus or the information of the target application recommended to be disabled.

In an example, in a case that the electronic device is in the charging state, the electronic device can detect an impact of an enabled high-load application on a charging rate in real time, and if the impact is significant (for example, exceeding a threshold), the electronic device can update display of a target charging curve, and display prompt information, where the prompt information is used to prompt the user of disabling the running high-load application. The user can adjust a charging behavior in time according to the target charging curve and the prompt information.

This way, when the electronic device detects that the first charging apparatus is not the most matching charging apparatus, the electronic device can display the recommended charging apparatus or the information about a target application recommended to be disabled, so that the user can switch the charging apparatus to a charging apparatus with a better charging effect, and can disable an application to reduce power consumption, which can improve a charging effect and save charging time.

It should be noted that whether the electronic device displays a charging curve with a better charging effect, whether to display the prompt information, whether to display a unit of an abscissa and ordinate, and the like, can be set by the system by default or set by the user, which is not limited in this embodiment of the present disclosure.

Figure 10:
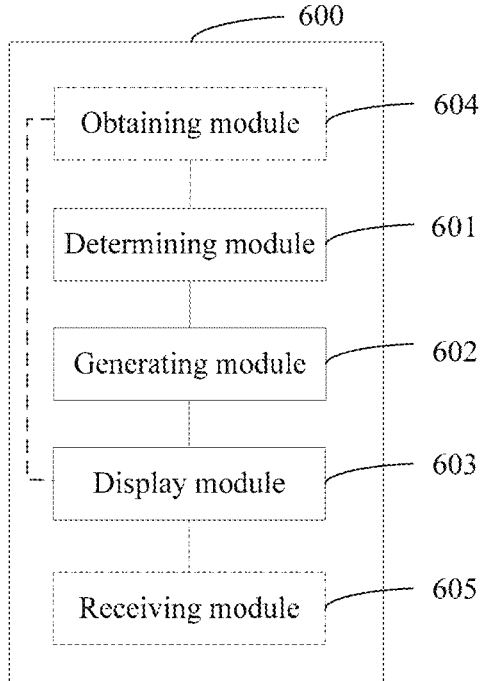
FIG. 10 is a schematic structural diagram of a power display apparatus according to an embodiment of the present disclosure.

FIG. 10 is a possible schematic structural diagram for implementing a power display apparatus according to an embodiment of the present disclosure. As shown in FIG. 10, a power display apparatus 600 includes: a determining module 601, a generating module 602, and a display module 603. The determining module 601 is configured to: determine a target charging power in each of N pieces of preset duration in a case that a target condition is satisfied, to obtain N target charging power; and determine a target consumed power in each of the N pieces of preset duration, to obtain N target consumed power, where N is a positive integer. The generating module 602 is configured to generate a target charging curve according to a current remaining power of the electronic device, and the N target charging power and the N target consumed power determined by the determining module 601. The display module 603 is configured to display the target charging curve generated by the generating module 602. The target condition is that the electronic device is in a charging state, or the electronic device is in a simulated charging state.

Optionally, as shown in FIG. 10, the apparatus 600 further includes: an obtaining module 604, where the obtaining module 604 is configured to obtain first charging information of the electronic device; and the determining module 601 is specifically configured to determine the target charging power in each of the N pieces of preset duration according to the first charging information obtained by the obtaining module 604, to obtain the N target charging power.

Optionally, as shown in FIG. 10, the apparatus 600 further includes: an obtaining module 604, where the obtaining module 604 is configured to obtain first power consumption information of the electronic device; and the determining module 601 is configured to determine the target consumed power in each of the N pieces of preset duration according to the first power consumption information obtained by the obtaining module 604, to obtain N target consumed power.

Optionally, the determining module 601 is further configured to determine: a start point of the target charging curve according to the remaining power; a target charged power in each piece of preset duration according to the target charging power and the target consumed power in each piece of preset duration; and a target point corresponding to each piece of preset duration on the target charging curve according to the target charged power; and the generating module 602 is configured to generate the target charging curve according to the start point and target point determined by the determining module 601.

Optionally, as shown in FIG. 10, the apparatus 600 further includes: a receiving module 605, where the receiving module 605 is configured to receive an input by the user on a first point in N target points in a case that the target charging curve includes the N target points, and each target point corresponds to one target charged power and one of the N pieces of preset duration; and the display module 603 is further configured to display, in response to the input received by the receiving module 605, a target charged power and preset duration corresponding to the first point in a preset region corresponding to the first point.

Optionally, as shown in FIG. 10, the apparatus 600 further includes: an obtaining module 604; and the foregoing target condition is that the electronic device is in a charging state; the obtaining module 604 is configured to obtain, in a case that the electronic device is in the charging state, a parameter of a first charging apparatus connected to the electronic device; and the display module 603 is further configured to display, in a case that the parameter of the first charging apparatus obtained by the obtaining module 604 does not match a preset parameter, an identifier of a recommended charging apparatus, and/or display information about a target application recommended to be disabled.

Optionally, the target charging curve includes at least two charging curves, and a preset charging parameter corresponding to each charging curve is not all the same; and the display module 603 is further configured to display at least two charging curves in a same coordinate system.

It should be noted that, as shown in FIG. 10, modules that must be included in the power display apparatus 600 are illustrated by solid line frames, such as the determining module 601; and modules that may or may not be included in the power display apparatus 600 is illustrated by dashed line frames, such as the receiving module 605.

In the power display apparatus provided in this embodiment of the present disclosure, in a case that the power display apparatus satisfies a target condition (the electronic device is in a charging state or in a simulated charging state), the electronic device can determine a target charging power in each of N pieces of preset duration, to obtain N target charging power, and determine a target consumed power in each of the N pieces of preset duration, to obtain N target consumed power. Afterwards, the power display apparatus can generate a target charging curve according to a current remaining power, the N target charging power, and the N target consumed power of the electronic device. Next, the power display apparatus can display the target charging curve. Compared with a traditional way in which the electronic device prompts the user of a current charging progress of the electronic device, through the foregoing solution, the power display apparatus can visually display a future charging situation of the electronic device to the user by displaying the target charging curve, so that the user can not only view the current charging progress, but also view the future charging situation, which improves flexibility for prompting power by the electronic device.

The power display apparatus provided in this embodiment of the present disclosure can implement each process in the foregoing method embodiment, and to avoid repetition, details are not repeated herein again.

Figure 11:
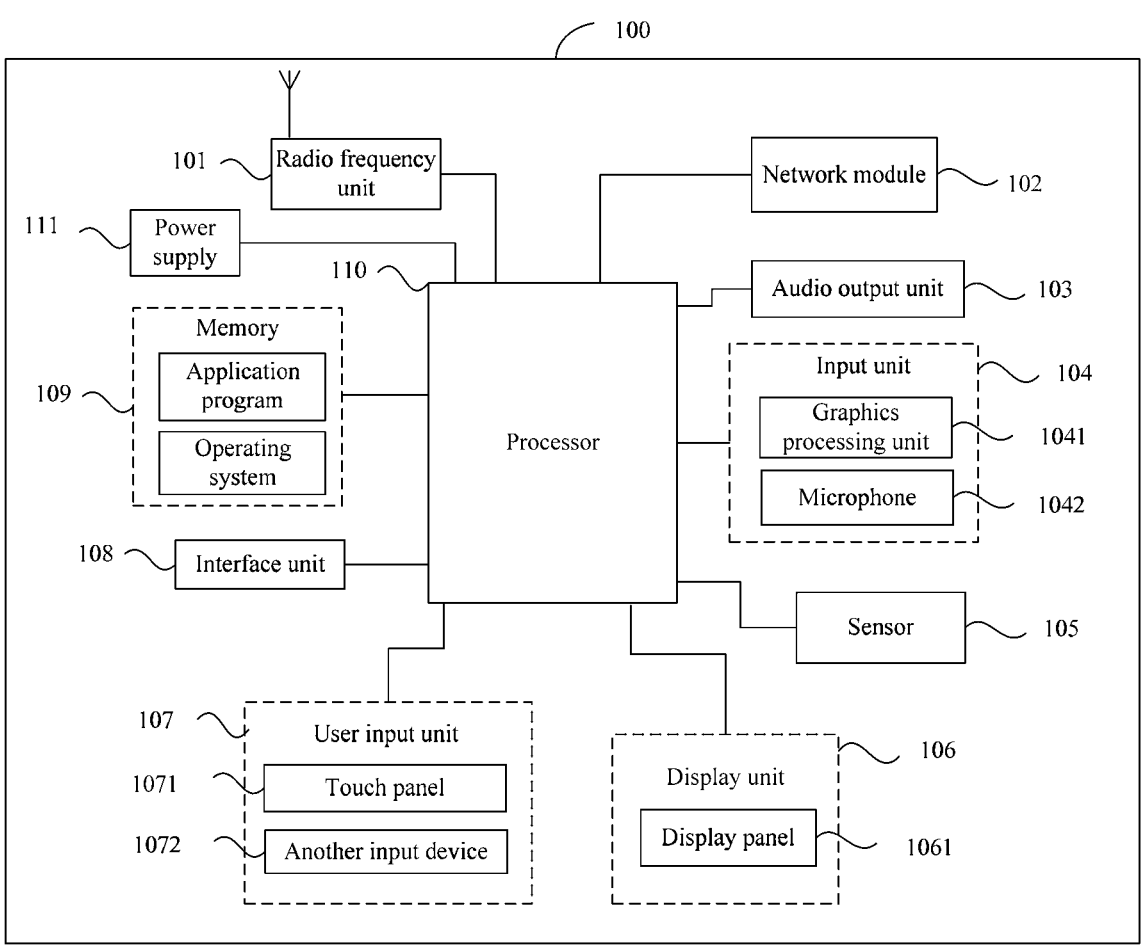
FIG. 11 is a schematic structural diagram of an electronic device according to an embodiment of the present disclosure.

FIG. 11 is a schematic diagram of a hardware structure of an electronic device for implementing the embodiments of the present disclosure. The electronic device 100 includes but is not limited to components such as a radio frequency unit 101, a network module 102, an audio output unit 103, an input unit 104, a sensor 105, a display unit 106, a user input unit 107, an interface unit 108, a memory 109, a processor 110, and a power supply 111. A person skilled in the art may understand that a structure of the electronic device 100 shown in FIG. 11 does not constitute a limitation on the electronic device, and the electronic device 100 may include more or fewer components than those shown in the figure, or combine some components, or have different component arrangements. In this embodiment of the present disclosure, the electronic device 100 includes but is not limited to a mobile phone, a tablet computer, a laptop computer, a palmtop computer, an in-vehicle electronic device, a wearable device, a pedometer, and the like.

The processor 110 is configured to: determine, in a case that a target condition is satisfied, a target charging power in each of N pieces of preset duration, to obtain N target charging power; and determine a target consumed power in each of the N pieces of preset duration, to obtain N target consumed power, where N is a positive integer; and generate a target charging curve according to a current remaining power of the electronic device, and the N target charging power and the N target consumed power determined by the determining module. The display unit 106 is configured to display a target charging curve generated by the processor 110. The target condition is that the electronic device is in a charging state, or the electronic device is in a simulated charging state.

In the electronic device provided in this embodiment of the present disclosure, in a case that the electronic device satisfies a target condition (the electronic device is in the charging state or in the simulated charging state), the electronic device can determine a target charging power in each of N pieces of preset duration, to obtain N target charging power, and determine a target consumed power in each of the N pieces of preset duration, to obtain N target consumed power. Afterwards, the electronic device can generate a target charging curve according to a current remaining power, the N target charging power, and the N target consumed power of the electronic device. Next, the electronic device can display the target charging curve. Compared with a traditional way in which the electronic device prompts the user of a current charging progress of the electronic device, through the foregoing solution, the electronic device can visually display a future charging situation of the electronic device to the user by displaying the target charging curve, so that the user can not only view the current charging progress, but also view the future charging situation, which improves flexibility for prompting power by the electronic device.

It should be understood that, in this embodiment of the present disclosure, the radio frequency unit 101 may be configured to receive and send information or a signal in a call process. Alternatively, after receiving downlink data from a base station, the radio frequency unit sends the downlink data to the processor 110 for processing. In addition, the radio frequency unit sends uplink data to the base station. Usually, the radio frequency unit 101 includes but is not limited to an antenna, at least one amplifier, a transceiver, a coupler, a low noise amplifier, a duplexer, and the like. In addition, the radio frequency unit 101 may communicate with a network and another device through a wireless communication system.

The electronic device 100 provides the user with wireless broadband Internet access through the network module 102, for example, helps the user receive and send e-mails, browse web pages, access streaming media, and the like.

The audio output unit 103 may convert audio data received by the radio frequency unit 101 or the network module 102 or stored in the memory 109 into an audio signal and output the audio signal as sound. Moreover, the audio output unit 103 can further provide audio output related to a specific function performed by the electronic device 100 (for example, call signal received sound and message received sound). The audio output unit 103 includes a speaker, a buzzer, a telephone receiver, and the like.

The input unit 104 is configured to receive an audio signal or a video signal. The input unit 104 may include a graphics processing unit (Graphics Processing Unit, GPU) 1041 and a microphone 1042. The graphics processing unit 1041 processes image data of a static image or video obtained by an image capture apparatus (such as, a camera) in a video capture mode or an image capture mode. A processed image frame may be displayed on the display unit 106. The image frame processed by the graphics processing unit 1041 may be stored in the memory 109 (or another storage medium) or sent by using the radio frequency unit 101 or the network module 102. The microphone 1042 may receive sound and can process such sound into audio data. Processed audio data may be converted, in a call mode, into a format that can be sent to a mobile communication base station by using the radio frequency unit 101 for output.

The electronic device 100 further includes at least one sensor 105, for example, a light sensor, a motion sensor, and another sensor. Alternatively, the light sensor includes an ambient light sensor and a proximity sensor. The ambient light sensor may adjust luminance of the display panel 1061 based on brightness of ambient light. The proximity sensor may turn off the display panel 1061 and/or backlight when the electronic device 100 moves close to an ear. As a type of the motion sensor, an accelerometer sensor may detect an acceleration value in each direction (generally, three axes), and detect a value and a direction of gravity when the accelerometer sensor is static, and may be configured to recognize a posture of the electronic device (such as screen switching between landscape and portrait modes, a related game, or magnetometer posture calibration), a function related to vibration recognition (such as a pedometer or a knock), and the like. The sensor 105 may further include a fingerprint sensor, a pressure sensor, an iris sensor, a molecular sensor, a gyroscope, a barometer, a hygrometer, a thermometer, an infrared sensor, and the like. Details are not described herein.

The display unit 106 is configured to display information entered by a user or information provided for a user. The display unit 106 may include a display panel 1061, and the display panel 1061 may be configured in a form of a liquid crystal display (Liquid Crystal Display, LCD), an organic light-emitting diode (Organic Light-Emitting Diode, OLED), or the like.

The user input unit 107 may be configured to: receive entered digital or character information, and generate key signal input related to a user setting and function control of the electronic device 100. Alternatively, the user input unit 107 includes a touch panel 1071 and another input device 1072. The touch panel 1071 is also referred to as a touchscreen, and may collect a touch operation of the user on or near the touch panel 1071 (for example, an operation performed on or near the touch panel 1071 by the user by using any appropriate object or accessory such as a finger or a stylus). The touch panel 1071 may include two parts: a touch detection apparatus and a touch controller. The touch detection apparatus detects a touch location of the user, detects a signal brought by the touch operation, and sends the signal to the touch controller. The touch controller receives touch information from the touch detection apparatus, converts the touch information into touch point coordinates, sends the touch point coordinates to the processor 110, and receives and executes a command sent by the processor 110. In addition, the touch panel 1071 may be implemented by using multiple types such as a resistive type, a capacitive type, an infrared ray, and a surface acoustic wave. In addition to the touch panel 1071, the user input unit 107 may further include the another input device 1072. Alternatively, the another input device 1072 may include but is not limited to a physical keyboard, a functional button (such as a volume control button or a power on/off button), a trackball, a mouse, and a joystick. Details are not described herein.

Further, the touch panel 1071 may cover the display panel 1061. When detecting a touch operation on or near the touch panel 1071, the touch panel 1071 transmits the touch operation to the processor 110 to determine a type of a touch event. Then, the processor 110 provides corresponding visual output on the display panel 1061 based on the type of the touch event. Although the touch panel 1071 and the display panel 1061 in FIG. 11 are configured as two independent components to implement input and output functions of the electronic device 100, in some embodiments, the touch panel 1071 and the display panel 1061 may be integrated to implement the input and output functions of the electronic device 100. Details are not limited herein.

The interface unit 108 is an interface for connecting an external apparatus with the electronic device 100. For example, the external apparatus may include a wired or wireless headset jack, an external power supply (or a battery charger) port, a wired or wireless data port, a storage card port, a port for connecting an apparatus having an identification module, an audio input/output (I/O) port, a video I/O port, a headset jack, or the like. The interface unit 108 may be configured to receive an input (for example, data information and power) from an external apparatus and transmit the received input to one or more elements in the electronic device 100, or may be configured to transmit data between the electronic device 100 and the external apparatus.

The memory 109 may be configured to store a software program and various pieces of data. The memory 109 may mainly include a program storage region and a data storage region. The program storage region may store an operating system, an application required by at least one function (such as a sound play function or an image play function), and the like. The data storage region may store data (such as audio data or an address book) created based on use of the mobile phone, and the like. In addition, the memory 109 may include a high-speed random access memory, and may further include a nonvolatile memory, for example, at least one magnetic disk storage device, a flash storage device, or another volatile solid-state storage device.

The processor 110 is a control center of the electronic device 100, connects all parts of the entire electronic device 100 by using various interfaces and lines, and performs various functions of the electronic device 100 and data processing by running or executing a software program and/or a module that are/is stored in the memory 109 and by calling data stored in the memory 109, thereby performing overall monitoring on the electronic device 100. The processor 110 may include one or more processing units. Optionally, the processor 110 may be integrated with an application processor and a modem processor. The application processor mainly processes an operating system, a user screen, an application, and the like, and the modem processor mainly processes wireless communication. It can be understood that, alternatively, the modem processor may not be integrated into the processor 110.

The electronic device 100 may further include the power supply 111 (such as a battery) supplying power to each component. Preferably, the power supply 111 may be logically connected to the processor 110 by using a power management system, so as to implement functions such as charging management, discharging management, and power consumption management by using the power management system.

In addition, the electronic device 100 includes some function modules not shown. Details are not described herein.

Optionally, an embodiment of the present disclosure further provides an electronic device, including a processor, a memory, and a computer program that is stored in the memory and that can be run on the processor. When the computer program is executed by the processor 110, processes of the foregoing embodiments of the power display method are implemented, and a same technical effect can be achieved. To avoid repetition, details are not described herein again.

An embodiment of the present disclosure further provides a computer-readable storage medium. The computer-readable storage medium stores a computer program, and when the computer program is executed by a processor, the processes of the foregoing embodiments of the power display method are implemented and a same technical effect can be achieved. To avoid repetition, details are not described herein again. The computer-readable storage medium is, for example, a read-only memory (ROM for short), a random access memory (RAM for short), a magnetic disk, or an optical disk.

It should be noted that, in this specification, the terms "include", "comprise", or any of their variants are intended to cover a non-exclusive inclusion, so that a process, a method, an article, or an apparatus that includes a list of elements not only includes those elements but also includes other elements that are not expressly listed, or further includes elements inherent to such process, method, article, or apparatus. An element limited by "includes a . . . " does not, without more constraints, preclude the presence of additional identical elements in the process, method, article, or apparatus that includes the element.

Based on the descriptions of the foregoing implementation manners, a person skilled in the art may clearly understand that the method in the foregoing embodiment may be implemented by software in addition to a necessary universal hardware platform or by hardware only. In most circumstances, the former is a preferred implementation manner. Based on such understanding, the technical solutions of this application essentially, or the part contributing to the prior art may be implemented in a form of a software product. The computer software product is stored in a storage medium (for example, a ROM/RAM, a magnetic disk, or a compact disc), and includes several instructions for instructing an electronic device (which may be a mobile phone, a computer, a server, an air conditioner, a network device, or the like) to perform the method described in the embodiments of this application.

The embodiments of this application are described above with reference to the accompanying drawings, but this application is not limited to the foregoing specific implementation manners. The foregoing specific implementation manners are merely schematic instead of restrictive. Under enlightenment of this application, a person of ordinary skills in the art may make many forms without departing from aims and the protection scope of claims of this application, all of which fall within the protection scope of this application.

What is claimed is:

1. A power display method, comprising:
determining, in a case that a target condition is satisfied, a target charging power in each of N pieces of preset duration, to obtain N target charging power, wherein N is a positive integer;
determining a target consumed power in each of the N pieces of preset duration, to obtain N target consumed power;
generating a target charging curve according to a current remaining power, the N target charging power, and the N target consumed power of the electronic device, wherein the current remaining power is a power of the electronic device corresponding to a start time of a first piece of preset duration among the N pieces of preset duration, and the start time is determined based on a first input of a user; and
displaying the target charging curve,
wherein the target condition is that the electronic device is in a charging state, or the electronic device is in a simulated charging state, wherein the simulated charging state is that the electronic device is not electrically connected to a charging apparatus of the electronic device.

2. The method according to claim 1, wherein the determining a target charging power in each of N pieces of preset duration, to obtain N target charging power comprises:

obtaining first charging information of the electronic device; and determining the target charging power in each of the N pieces of preset duration according to the first charging information, to obtain the N target charging power.

3. The method according to claim 1, wherein the determining a target consumed power in each of the N pieces of preset duration, to obtain N target consumed power comprises:

obtaining first power consumption information of the electronic device; and determining the target consumed power in each of the N pieces of preset duration according to the first power consumption information, to obtain the N target consumed power.

4. The method according to claim 1, wherein the generating a target charging curve according to a current remaining power, the N target charging power, and the N target consumed power of the electronic device comprises:

determining a start point of the target charging curve according to the remaining power;

determining a target charged power in each piece of preset duration according to the target charging power and the target consumed power in each piece of preset duration;

determining a target point corresponding to each piece of preset duration on the target charging curve according to the target charged power; and generating the target charging curve according to the start point and the target point.

5. The method according to claim 4, wherein the target charging curve comprises N target points, and each target point corresponds to one target charged power and one of the N pieces of preset duration; and after the displaying the target charging curve, the method further comprises:

receiving an input by the user on a first point of the N target points; and displaying, in response to the input, a target charged power and preset duration corresponding to the first point in a preset region corresponding to the first point.

6. The method according to claim 1, wherein the target condition is that the electronic device is in the charging state, and the method further comprises:

obtaining, in a case that the electronic device is in the charging state, a parameter of a first charging apparatus connected to the electronic device; and displaying, in a case that the parameter of the first charging apparatus does not match a preset parameter, an identifier of a recommended charging apparatus and/or information about a target application recommended to be disabled.

7. The method according to claim 1, wherein the target charging curve comprises at least two charging curves, and a preset charging parameter corresponding to each charging curve is not all the same; and the displaying the target charging curve comprises:

displaying the at least two charging curves in a same coordinate system.

8. An electronic device, comprising:

a processor; and a memory storing a computer program that is capable of running on the processor, wherein the computer program, when executed by the processor, causes the electronic device to perform the following steps:

determining, in a case that a target condition is satisfied, a target charging power in each of N pieces of preset duration, to obtain N target charging power, wherein N is a positive integer;

determining a target consumed power in each of the N pieces of preset duration, to obtain N target consumed power;

generating a target charging curve according to a current remaining power, the N target charging power, and the N target consumed power of the electronic device, wherein the current remaining power is a power of the electronic device corresponding to a start time of a first piece of preset duration among the N pieces of preset duration, and the start time is determined based on a first input of a user; and displaying the target charging curve, wherein the target condition is that the electronic device is in a charging state, or the electronic device is in a simulated charging state, wherein the simulated charging state is that the electronic device is not electrically connected to a charging apparatus of the electronic device.

9. The electronic device according to claim 8, wherein the determining a target charging power in each of N pieces of preset duration, to obtain N target charging power comprises:

obtaining first charging information of the electronic device; and determining the target charging power in each of the N pieces of preset duration according to the first charging information, to obtain the N target charging power.

10. The electronic device according to claim 8, wherein the determining a target consumed power in each of the N pieces of preset duration, to obtain N target consumed power comprises:

obtaining first power consumption information of the electronic device; and determining the target consumed power in each of the N pieces of preset duration according to the first power consumption information, to obtain the N target consumed power.

11. The electronic device according to claim 8, wherein the generating a target charging curve according to a current remaining power, the N target charging power, and the N target consumed power of the electronic device comprises:

determining a start point of the target charging curve according to the remaining power;

determining a target charged power in each piece of preset duration according to the target charging power and the target consumed power in each piece of preset duration;

determining a target point corresponding to each piece of preset duration on the target charging curve according to the target charged power; and generating the target charging curve according to the start point and the target point.

12. The electronic device according to claim 11, wherein the target charging curve comprises N target points, and each target point corresponds to one target charged power and one of the N pieces of preset duration; and after the displaying the target charging curve, the computer program, when executed by the processor, causes the electronic device to further perform the following steps:

receiving an input by the user on a first point of the N target points; and displaying, in response to the input, a target charged power and preset duration corresponding to the first point in a preset region corresponding to the first point.

13. The electronic device according to claim 8, wherein the target condition is that the electronic device is in the charging state, the computer program, when executed by the processor, causes the electronic device to further perform the following steps:

obtaining, in a case that the electronic device is in the charging state, a parameter of a first charging apparatus connected to the electronic device; and displaying, in a case that the parameter of the first charging apparatus does not match a preset parameter, an identifier of a recommended charging apparatus and/or information about a target application recommended to be disabled.

14. The electronic device according to claim 8, wherein the target charging curve comprises at least two charging curves, and a preset charging parameter corresponding to each charging curve is not all the same; and the displaying the target charging curve comprises:

displaying the at least two charging curves in a same coordinate system.

15. A non-transitory computer-readable storage medium storing a computer program, wherein the computer program, when executed by a processor, performs the following steps:

determining, in a case that a target condition is satisfied, a target charging power in each of N pieces of preset duration, to obtain N target charging power, wherein N is a positive integer;

determining a target consumed power in each of the N pieces of preset duration, to obtain N target consumed power;

generating a target charging curve according to a current remaining power, the N target charging power, and the N target consumed power of the electronic device, wherein the current remaining power is a power of the electronic device corresponding to a start time of a first piece of preset duration among the N pieces of preset duration, and the start time is determined based on a first input of a user; and displaying the target charging curve, wherein the target condition is that the electronic device is in a charging state, or the electronic device is in a simulated charging state, wherein the simulated charging state is that the electronic device is not electrically connected to a charging apparatus of the electronic device.

16. The electronic device according to claim 15, wherein the determining a target charging power in each of N pieces of preset duration, to obtain N target charging power comprises:

obtaining first charging information of the electronic device; and determining the target charging power in each of the N pieces of preset duration according to the first charging information, to obtain the N target charging power.

17. The electronic device according to claim 15, wherein the determining a target consumed power in each of the N pieces of preset duration, to obtain N target consumed power comprises:

obtaining first power consumption information of the electronic device; and determining the target consumed power in each of the N pieces of preset duration according to the first power consumption information, to obtain the N target consumed power.

18. The electronic device according to claim 15, wherein the generating a target charging curve according to a current remaining power, the N target charging power, and the N target consumed power of the electronic device comprises:

determining a start point of the target charging curve according to the remaining power;

determining a target charged power in each piece of preset duration according to the target charging power and the target consumed power in each piece of preset duration;

determining a target point corresponding to each piece of preset duration on the target charging curve according to the target charged power; and generating the target charging curve according to the start point and the target point.

19. The electronic device according to claim 18, wherein the target charging curve comprises N target points, and each target point corresponds to one target charged power and one of the N pieces of preset duration; and after the displaying the target charging curve, the computer program, when executed by the processor, further performs the following steps:

receiving an input by the user on a first point of the N target points; and displaying, in response to the input, a target charged power and preset duration corresponding to the first point in a preset region corresponding to the first point.

20. The electronic device according to claim 15, wherein the target condition is that the electronic device is in the charging state, the computer program, when executed by the processor, further performs the following steps:

obtaining, in a case that the electronic device is in the charging state, a parameter of a first charging apparatus connected to the electronic device; and displaying, in a case that the parameter of the first charging apparatus does not match a preset parameter, an identifier of a recommended charging apparatus and/or information about a target application recommended to be disabled.

* * * * *